US011646070B2

(12) United States Patent
Bedeschi

(10) Patent No.: US 11,646,070 B2
(45) Date of Patent: May 9, 2023

(54) MEMORY CELL SENSING USING AN AVERAGED REFERENCE VOLTAGE

(71) Applicant: Micron Technology, Inc., Boise, ID (US)

(72) Inventor: Ferdinando Bedeschi, Biassono (IT)

(73) Assignee: Micron Technology, Inc., Boise, ID (US)

( * ) Notice: Subject to any disclaimer, the term of this patent is extended or adjusted under 35 U.S.C. 154(b) by 29 days.

(21) Appl. No.: 17/499,492

(22) Filed: Oct. 12, 2021

(65) Prior Publication Data

US 2023/0113652 A1    Apr. 13, 2023

(51) Int. Cl.
*G11C 11/22* (2006.01)

(52) U.S. Cl.
CPC ........ *G11C 11/2273* (2013.01); *G11C 11/221* (2013.01)

(58) Field of Classification Search
CPC .................... G11C 11/2273; G11C 11/221
See application file for complete search history.

(56) References Cited

U.S. PATENT DOCUMENTS

| 8,681,547 | B2* | 3/2014 | Shen | G11C 16/26 |
| | | | | 365/185.09 |
| 9,312,000 | B1* | 4/2016 | Song | G11C 16/26 |
| 10,224,094 | B1* | 3/2019 | Pelley | G11C 5/147 |
| 2012/0275212 | A1* | 11/2012 | Jung | G11C 13/0069 |
| | | | | 365/189.15 |
| 2018/0247687 | A1* | 8/2018 | Vimercati | G11C 11/221 |
| 2021/0065763 | A1* | 3/2021 | Di Vincenzo | G11C 11/2257 |

* cited by examiner

Primary Examiner — Khamdan N. Alrobaie
(74) Attorney, Agent, or Firm — Holland & Hart LLP

(57) ABSTRACT

Methods, systems, and devices for memory cell sensing using an averaged reference voltage are described. A memory device may generate the averaged reference voltage that is specific to operating conditions or characteristics. The averaged reference voltage thus may track variations in cell use and cell characteristics. The memory device may generate the averaged reference voltage by shorting together reference nodes to determine an average of values associated with the reference nodes. The reference nodes may be associated with a codeword, which may store values corresponding to the reference nodes. The codeword may be balanced or nearly balanced to include equal or nearly equal quantities of different logic values.

25 Claims, 7 Drawing Sheets

MEMORY CELL SENSING USING AN AVERAGED REFERENCE VOLTAGE

FIELD OF TECHNOLOGY

The following relates generally to one or more systems for memory and more specifically to memory cell sensing using an averaged reference voltage.

BACKGROUND

Memory devices are widely used to store information in various electronic devices such as computers, user devices, wireless communication devices, cameras, digital displays, and the like. Information is stored by programming memory cells within a memory device to various states. For example, binary memory cells may be programmed to one of two supported states, often denoted by a logic 1 or a logic 0. In some examples, a single memory cell may support more than two states, any one of which may be stored. To access the stored information, a component of the device may read, or sense, at least one stored state in the memory device. To store information, a component of the device may write, or program, the state in the memory device.

Various types of memory devices exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), and others. Memory devices may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source. FeRAM may be able to achieve densities similar to volatile memory but may have non-volatile properties due to the use of a ferroelectric capacitor as a storage device.

DETAILED DESCRIPTION

Figure 1:
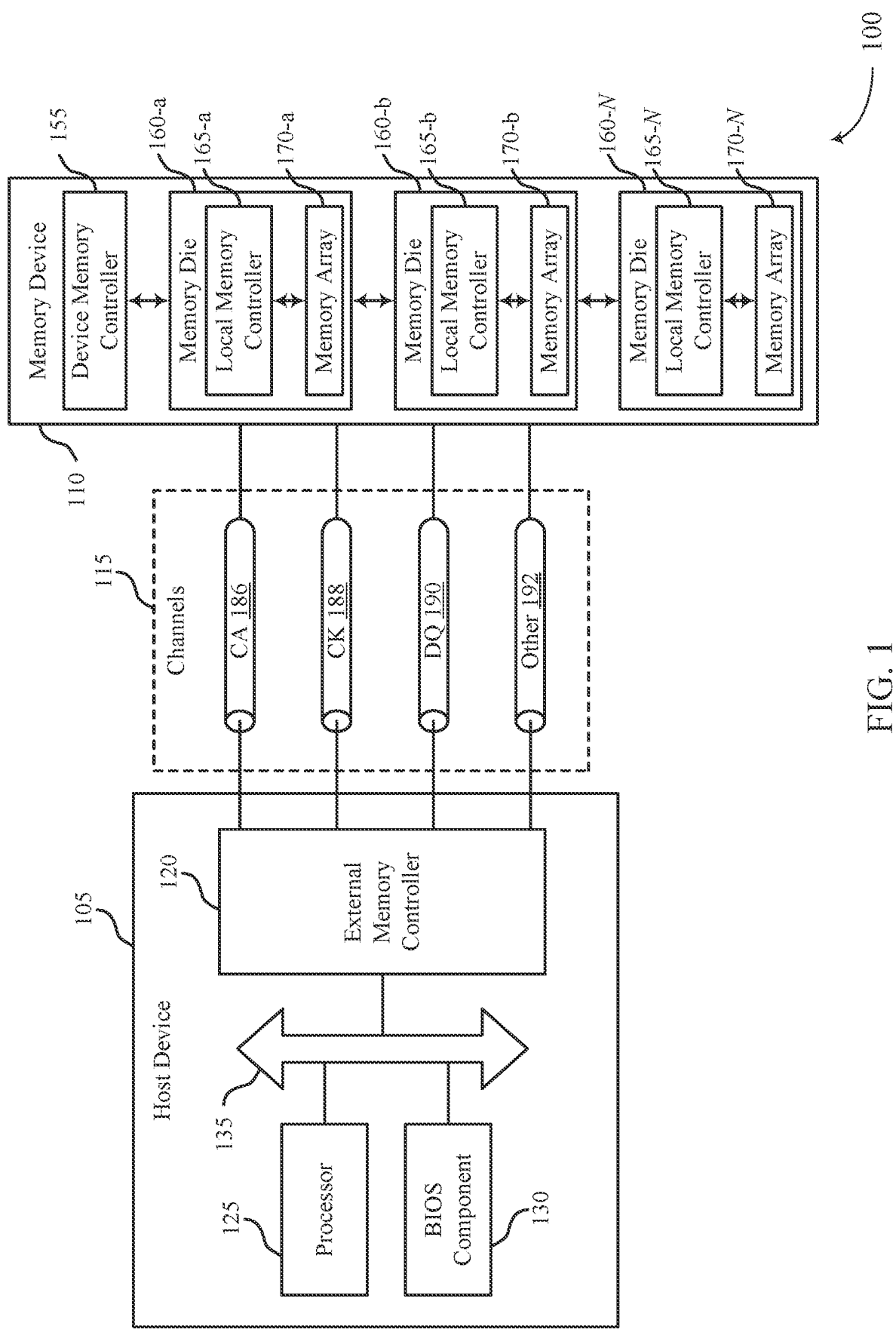
FIG. 1 illustrates an example of a system that supports memory cell sensing using an averaged reference voltage in accordance with examples as disclosed herein.

A memory cell may include a storage component that is used to store a logic value. For example, a cell may store either a logic 0 or a logic 1, which may each correspond to a respective charge (e.g., amount or polarity of charge) stored at the memory cell, and to a respective voltage associated with the stored charge. A memory device may perform a read operation to determine a stored logic state of a memory cell. During the read operation, a sense component of the memory device may compare a voltage associated with a charge extracted from (or supplied to) the memory cell to a reference voltage. An ideal reference voltage may be a voltage that has a value halfway between the respective voltages for a logic 0 and a logic 1. In some cases, the reference voltage for a memory device may be predetermined (e.g., set at a fabrication or testing stage of the memory device). For example, a fixed value may be programmed or set as a reference voltage for the memory device. However, the voltages for the logic states (e.g., stored logic 1 or logic 0) may fluctuate over time, for example, based on variations in cell use, degradation over time or the course of operation, or other cell characteristics.

In accordance with the techniques described herein, a memory device may generate an averaged reference voltage that is based on operating conditions or characteristics of multiple memory cells (e.g., a codeword) of the memory device (e.g., the reference voltage may be a self-reference voltage that tracks variations in cell use or cell characteristics, but across multiple memory cells—e.g., as opposed to a self-reference voltage generated based on a single memory cell). While some of the examples herein are described with reference to ferroelectric memory devices and operations, the same examples may apply to any type of memory device, and associated operations, without departing from the scope of the present disclosure.

For example, a memory device may invert one or more bits of a codeword (e.g., stored across multiple memory cells) to obtain a balanced or quasi-balanced codeword (e.g., according to an algorithm such as a Knuth Algorithm or a variation thereof). When reading a logic value of a memory cell, the memory device may develop a voltage representative of the logic state at a sense node and a reference node associated with the memory cell. The memory device may develop such voltages for each memory cell of the multiple memory cells associated with (e.g., storing respective bits of) the codeword), may decouple the sense and reference nodes for each memory cell, and may short together the reference nodes for the multiple memory cells. By coupling the reference nodes, the memory device may generate an average (e.g., an analog average) voltage value associated with the multiple memory cells. This reference voltage may account for variations in memory cell voltages due to cell use or cell characteristics, cell degradation, or other factors, and thus may increase accuracy for determining stored logic states of memory cells of the memory device.

Features of the disclosure are initially described in the context of systems and dies as described with reference to FIGS. 1 and 2. Features of the disclosure are described in the context of a distribution plot, a bit balancing scheme, and a circuit as described with reference to FIGS. 3-5. These and other features of the disclosure are further illustrated by and described with reference to an apparatus diagram and flowcharts that relate to memory cell sensing using an averaged reference voltage as described with reference to FIGS. 6 and 7.

FIG. 1 illustrates an example of a system 100 that supports memory cell sensing using an averaged reference voltage in accordance with examples as disclosed herein. The system 100 may include a host device 105, a memory device 110, and a plurality of channels 115 coupling the host device 105 with the memory device 110. The system 100 may include one or more memory devices 110, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system operable to store data for one or more other components of the system 100.

At least portions of the system 100 may be examples of the host device 105. The host device 105 may be an example of a processor or other circuitry within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, a system on a chip (SoC), or some other stationary or portable electronic device, among other examples. In some examples, the host device 105 may refer to the hardware, firmware, software, or a combination thereof that implements the functions of an external memory controller 120. In some examples, the external memory controller 120 may be referred to as a host or a host device 105.

A memory device 110 may be an independent device or a component that is operable to provide physical memory addresses/space that may be used or referenced by the system 100. In some examples, a memory device 110 may be configurable to work with one or more different types of host devices. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other factors.

The memory device 110 may be operable to store data for the components of the host device 105. In some examples, the memory device 110 may act as a secondary-type or dependent-type device to the host device 105 (e.g., responding to and executing commands provided by the host device 105 through the external memory controller 120). Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of the host device 105 may be coupled with one another using a bus 135.

The processor 125 may be operable to provide control or other functionality for at least portions of the system 100 or at least portions of the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or a combination of these components. In such examples, the processor 125 may be an example of a central processing unit (CPU), a graphics processing unit (GPU), a general purpose GPU (GPGPU), or an SoC, among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include a program or software stored in one or more of read-only memory (ROM), flash memory, or other non-volatile memory.

The memory device 110 may include a device memory controller 155 and one or more memory dies 160 (e.g., memory chips) to support a desired capacity or a specified capacity for data storage. Each memory die 160 (e.g., memory die 160 *a*, memory die 160 *b*, memory die 160 N) may include a local memory controller 165 (e.g., local memory controller 165-*a*, local memory controller 165-*b*, local memory controller 165-N) and a memory array 170 (e.g., memory array 170-*a*, memory array 170-*b*, memory array 170-N). A memory array 170 may be a collection (e.g., one or more grids, one or more banks, one or more tiles, one or more sections) of memory cells, with each memory cell being operable to store at least one bit of data. A memory device 110 including two or more memory dies 160 may be referred to as a multi-die memory or a multi-die package or a multi-chip memory or a multi-chip package.

The device memory controller 155 may include circuits, logic, or components operable to control operation of the memory device 110. The device memory controller 155 may include the hardware, the firmware, or the instructions that enable the memory device 110 to perform various operations and may be operable to receive, transmit, or execute commands, data, or control information related to the components of the memory device 110. The device memory controller 155 may be operable to communicate with one or more of the external memory controller 120, the one or more memory dies 160, or the processor 125. In some examples, the device memory controller 155 may control operation of the memory device 110 described herein in conjunction with the local memory controller 165 of the memory die 160.

In some examples, the memory device 110 may receive data or commands or both from the host device 105. For example, the memory device 110 may receive a write command indicating that the memory device 110 is to store data for the host device 105 or a read command indicating that the memory device 110 is to provide data stored in a memory die 160 to the host device 105.

A local memory controller 165 (e.g., local to a memory die 160) may include circuits, logic, or components operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165 or the external memory controller 120 may perform various functions described herein. As such, a local memory controller 165 may be operable to communicate with the device memory controller 155, with other local memory controllers 165, or directly with the external memory controller 120, or the processor 125, or a combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other circuits or controllers operable for supporting described operations of the device memory controller 155 or local memory controller 165 or both.

The external memory controller 120 may be operable to enable communication of one or more of information, data, or commands between components of the system 100 or the host device 105 (e.g., the processor 125) and the memory device 110. The external memory controller 120 may convert or translate communications exchanged between the components of the host device 105 and the memory device 110. In some examples, the external memory controller 120 or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 and the memory device 110. Each channel 115 may be examples of transmission mediums that carry information between the host device 105 and the memory device. Each channel 115 may include one or more signal paths or transmission mediums (e.g., conductors) between terminals associated with the components of the system 100. A signal path may be an example of a conductive path operable to carry a signal. For example, a channel 115 may include a first terminal including one or more pins or pads at the host device 105 and one or more pins or pads at the memory device 110. A pin may be an example of a conductive input or output point of a device of the system 100, and a pin may be operable to act as part of a channel.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or a combination thereof. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

In some cases, a memory device 110 may generate a reference voltage that is specific to operating characteristics of the memory device. For example, the memory device 110 may invert one or more bits of a codeword (e.g., one or more bits stored at a set of multiple memory cells) to obtain a balanced or quasi-balanced codeword. When reading a logic value of a memory cell of the codeword, the memory device 110 may develop a voltage representative of the logic state at a sense node and a reference node associated with the memory cell. The memory device 110 may develop such voltages for each memory cell of the multiple memory cells, may decouple the sense and reference nodes for each memory cell, and may short together the reference nodes for the multiple memory cells. By coupling the reference nodes, the memory device 110 may generate an average (e.g., an analog average) voltage value associated with the multiple memory cells, and this average voltage may then be used as a reference voltage for reading the reading the respective logic state of each of the memory cells and hence the bits of the codeword (e.g., based on the comparison of the sense node voltage for a memory cell to the average voltage obtained at the reference node for the memory cell).

Figure 2:
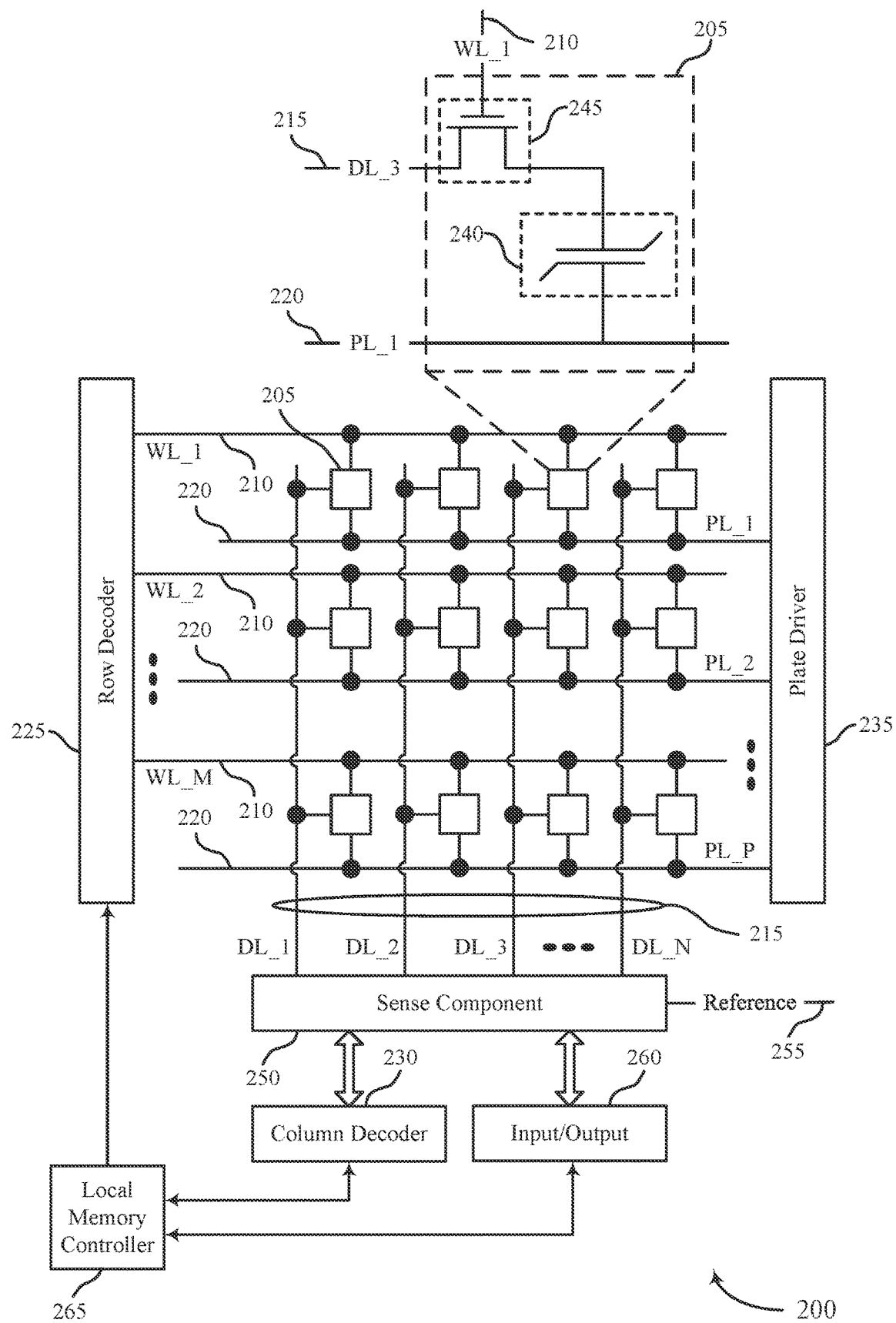
FIG. 2 illustrates an example of a memory die that supports memory cell sensing using an averaged reference voltage in accordance with examples as disclosed herein.

FIG. 2 illustrates an example of a memory die 200 that supports memory cell sensing using an averaged reference voltage in accordance with examples as disclosed herein. The memory die 200 may be an example of the memory dies 160 described with reference to FIG. 1. In some examples, the memory die 200 may be referred to as a memory chip, a memory device, or an electronic memory apparatus. The memory die 200 may include one or more memory cells 205 that may each be programmable to store different logic states (e.g., programmed to one of a set of two or more possible states). For example, a memory cell 205 may be operable to store one bit of information at a time (e.g., a logic 0 or a logic 1). In some examples, a memory cell 205 (e.g., a multi-level memory cell) may be operable to store more than one bit of information at a time (e.g., a logic 00, logic 01, logic 10, a logic 11). In some examples, the memory cells 205 may be arranged in an array, such as a memory array 170 described with reference to FIG. 1.

A memory cell 205 may store a state (e.g., polarization state or dielectric charge) representative of the programmable states in a capacitor. In FeRAM architectures, the memory cell 205 may include a capacitor 240 that includes a ferroelectric material to store a charge and/or a polarization representative of the programmable state. The memory cell 205 may include a logic storage component, such as capacitor 240, and a switching component 245. The capacitor 240 may be an example of a ferroelectric capacitor. A first node of the capacitor 240 may be coupled with the switching component 245 and a second node of the capacitor 240 may be coupled with a plate line 220. The switching component 245 may be an example of a transistor or any other type of switch device that selectively establishes or de-establishes electronic communication between two components. In some cases, the capacitor 240 may store either a logic 0 or a logic 1, which may correspond to a low voltage or a high voltage, respectively. In some cases, the amount of charge stored at a capacitor 240 when the memory cell 205 stores a given logic state may fluctuate over time. For example, the first time the capacitor 240 is programmed to a given state, such as a charge state corresponding to a logic 1, the capacitor 240 may store a first amount of charge. Later (e.g., after some quantity of subsequent read, write, or other access operations being performed on the memory cell 205), when the capacitor 240 is programmed to that same state, such as a charge state corresponding to a logic 1, the capacitor 240 may store a second amount of change that is different than the first amount of charge. For example, the amount of charge corresponding to a given logic state may fluctuate due to degradations of the memory cell 205, operating conditions of the memory cell 205, or other memory cell 205 characteristics.

The memory die 200 may include access lines (e.g., the word lines 210, the digit lines 215, and the plate lines 220) arranged in a pattern, such as a grid-like pattern. An access line may be a conductive line coupled with a memory cell 205 and may be used to perform access operations on the memory cell 205. In some examples, word lines 210 may be referred to as row lines. In some examples, digit lines 215 may be referred to as column lines or bit lines. References to access lines, row lines, column lines, word lines, digit lines, bit lines, or plate lines, or their analogues, are interchangeable without loss of understanding or operation. Memory cells 205 may be positioned at intersections of the word lines 210, the digit lines 215, and/or the plate lines 220.

Operations such as reading and writing may be performed on memory cells 205 by activating or selecting access lines such as a word line 210, a digit line 215, and/or a plate line 220. By biasing a word line 210, a digit line 215, and a plate line 220 (e.g., applying a voltage to the word line 210, digit line 215, or plate line 220), a single memory cell 205 may be accessed at their intersection. Activating or selecting a word line 210, a digit line 215, or a plate line 220 may include applying a voltage to the respective line.

Accessing the memory cells 205 may be controlled through a row decoder 225, a column decoder 230, and a plate driver 235. For example, a row decoder 225 may receive a row address from the local memory controller 265 and activate a word line 210 based on the received row address. A column decoder 230 receives a column address from the local memory controller 265 and activates a digit line 215 based on the received column address. A plate driver 235 may receive a plate address from the local memory controller 265 and activates a plate line 220 based on the received plate address.

Selecting or deselecting the memory cell 205 may be accomplished by activating or deactivating the switching component 245. The capacitor 240 may be in electronic communication with the digit line 215 using the switching component 245. For example, the capacitor 240 may be isolated from digit line 215 when the switching component 245 is deactivated, and the capacitor 240 may be coupled with digit line 215 when the switching component 245 is activated.

A word line 210 may be a conductive line in electronic communication with a memory cell 205 that is used to perform access operations on the memory cell 205. In some architectures, the word line 210 may be in electronic communication with a gate of a switching component 245 of a memory cell 205 and may be operable to control the switching component 245 of the memory cell. In some architectures, the word line 210 may be in electronic communication with a node of the capacitor of the memory cell 205 and the memory cell 205 may not include a switching component.

A digit line 215 may be a conductive line that connects the memory cell 205 with a sense component 250. In some architectures, the memory cell 205 may be selectively coupled with the digit line 215 during portions of an access operation. For example, the word line 210 and the switching component 245 of the memory cell 205 may be operable to selectively couple and/or isolate the capacitor 240 of the memory cell 205 and the digit line 215. In some architectures, the memory cell 205 may be in electronic communication (e.g., constant) with the digit line 215.

A plate line 220 may be a conductive line in electronic communication with a memory cell 205 that is used to perform access operations on the memory cell 205. The plate line 220 may be in electronic communication with a node (e.g., the cell bottom) of the capacitor 240. The plate line 220 may cooperate with the digit line 215 to bias the capacitor 240 during access operation of the memory cell 205.

The sense component 250 may determine a state (e.g., a polarization state or a charge) stored on the capacitor 240 of the memory cell 205 and determine a logic state of the memory cell 205 based on the detected state. The sense component 250 may include one or more sense amplifiers to amplify the signal output of the memory cell 205. The sense component 250 may compare the signal received from the memory cell 205 across the digit line 215 to a reference 255 (e.g., a reference voltage). The detected logic state of the memory cell 205 may be provided as an output of the sense component 250 (e.g., to an input/output 260), and may indicate the detected logic state to another component of a memory device 110 that includes the memory die 200. In some cases, the sense component 250 may be couplable with one or more nodes associated with the memory cell 205. For example, the sense component 250 may be couplable with a sense node and a reference node of the memory cell 205. In some cases, the sense component 250 may compare a voltage of the sense node (e.g., a voltage associated with the logic state of the memory cell 205) with a reference voltage, which may be the voltage of the reference node. In some cases, the sense component 250 may be or include an example of a differential amplifier, a latch circuit, or both.

The local memory controller 265 may control the operation of memory cells 205 through the various components (e.g., row decoder 225, column decoder 230, plate driver 235, and sense component 250). The local memory controller 265 may be an example of the local memory controller 165 described with reference to FIG. 1. In some examples, one or more of the row decoder 225, column decoder 230, and plate driver 235, and sense component 250 may be co-located with the local memory controller 265. The local memory controller 265 may be operable to receive one or more of commands or data from one or more different memory controllers (e.g., an external memory controller 120 associated with a host device 105, another controller associated with the memory die 200), translate the commands or the data (or both) into information that can be used by the memory die 200, perform one or more operations on the memory die 200, and communicate data from the memory die 200 to a host device 105 based on performing the one or more operations. The local memory controller 265 may generate row signals and column address signals to activate the target word line 210, the target digit line 215, and the target plate line 220. The local memory controller 265 may also generate and control various voltages or currents used during the operation of the memory die 200. In general, the amplitude, the shape, or the duration of an applied voltage or current discussed herein may be varied and may be different for the various operations discussed in operating the memory die 200.

The local memory controller 265 may be operable to perform one or more access operations on one or more memory cells 205 of the memory die 200. Examples of access operations may include a write operation, a read operation, a refresh operation, a precharge operation, or an activate operation, among others. In some examples, access operations may be performed by or otherwise coordinated by the local memory controller 265 in response to various access commands (e.g., from a host device 105). The local memory controller 265 may be operable to perform other access operations not listed here or other operations related to the operating of the memory die 200 that are not directly related to accessing the memory cells 205.

Figure 3:
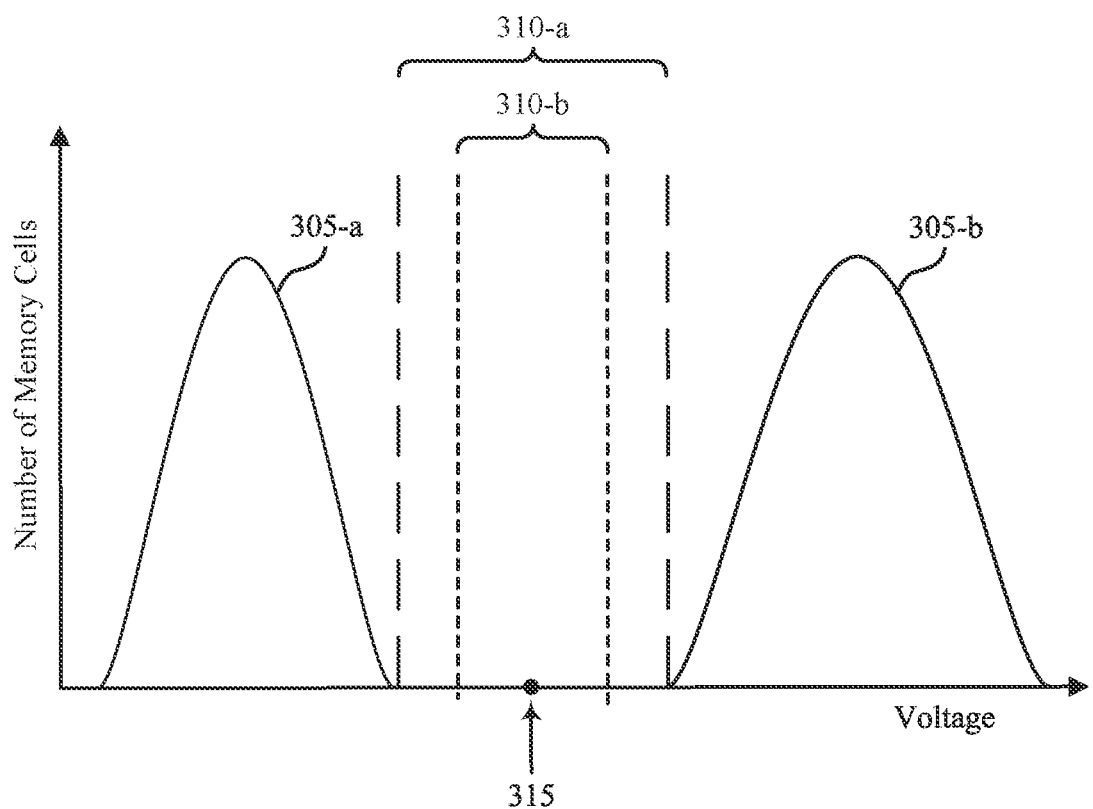
FIG. 3 illustrates an example of a distribution plot that supports memory cell sensing using an averaged reference voltage in accordance with examples as disclosed herein.

FIG. 3 illustrates an example of a distribution plot 300 that supports memory cell sensing using an averaged reference voltage in accordance with examples as disclosed herein. Distribution plot 300 may illustrate distributions 305-a and 305-b, which may correspond to distributions of voltages associated with memory cells 205 of a memory device, as described with reference to FIG. 2. For example, distribution 305-a may represent voltages associated with stored charge levels for a first set of multiple memory cells each written with a first logic value (e.g., a logic value '0') and distribution 305-b may represent voltages associated with stored charge levels for a second set of multiple memory cells ach written with a second logic value (e.g., a logic value '1'). Although distribution 305-a and distribution 305-b are depicted as similar in FIG. 3, distributions 305-a and 305-b may be different (e.g., may have different shapes or locations relative to each other). In some cases, stored charge levels corresponding to the same logic value may vary across memory cells (e.g., due to fabrication variations or usage rates), which may lead to the different, corresponding voltage levels within a respective distribution 305. Distribution plot 300 may additionally illustrate a reference voltage 315, and reference voltage windows 310-a and 310-b.

In some cases, the memory device may determine a stored logic state of a memory cell by comparing a voltage associated with the memory cell to a reference voltage 315. For example, a sense component may compare a reference voltage 315 to a voltage that is based on a charge extracted from (or supplied to) the memory cell. Ideally, the reference voltage 315 may be a voltage that has a value halfway between a voltage corresponding to a first logic value (e.g., logic 0) and a voltage corresponding to a second logic value (e.g., logic 1). As such, the memory device may compare the voltage associated with the memory cell to the reference voltage 315 to determine the logic state of the memory cell. For example, if the voltage associated with the memory cell is above the reference voltage, the logic state of the memory cell may be determined to be the second logic value (e.g., a value of '1') and if the voltage associated with the memory cell is below the reference voltage, the logic state of the memory cell may be determined to be the first logic value (e.g., a value of '0'), or vice versa.

In some cases, the reference voltage 315 used by a memory device may be predetermined (e.g., set at a fabrication or testing stage of the memory device). For example, a fixed voltage value may be programmed or set as a reference voltage 315 for a memory device. In some cases, a reference voltage 315 may be programmed or set based on a reference voltage window 310, which may be based on distributions 305-a and 305-b, which may be determined based on prior testing of like memory devices, for example. For example, a reference voltage window 310-a may include a range of voltages from a highest voltage of distribution 305-a to a lowest voltage of distribution 305-b. That is, the reference voltage window 310-a may include voltages between distribution 305-a and distribution 305-b, and may not include any voltages within distribution 305-a or 305-b. The reference voltage 315 may be set to a middle value (or nearly a middle value) of the reference voltage window 310-a, for example, in order to maintain a relatively high difference in voltage between the reference voltage 315 and any voltage of distribution 305-a or 305-b (e.g., in order to maintain a level of accuracy for reading a memory cell value using the reference voltage 315).

In some cases, however, voltages associated with memory cells may vary or shift (e.g., due to operating conditions or characteristics, usage, or other factors) and a shape and/or position of a distribution 305 may change. Accordingly, in some cases, a memory device may be programmed with a reference voltage 315 that is based on a reference voltage window 310-b that takes into account possible variation in distributions 305-a and 305-b. For example, reference voltage window 310-b may be estimated based on a scenario (e.g., a worst case scenario of a smallest reference voltage window 310) in which distribution 305-a and distribution 305-b shift inwards (e.g., shift toward each other). Such shrinking of the reference voltage window 310 may be referred to as window loss, and may result in lower accuracy when determining a logic value of a memory cell.

For example, in some cases, reference voltage window 310-b may not effectively account for movement of distributions 305-a and 305-b. For example, reference voltage window 310-b may be estimated based on a scenario, but distribution 305-a or distribution 305-b may overlap with the reference voltage window 310-b due to usage, operating conditions or characteristics, manufacturing differences, defects, or other factors. As a result, increased read errors may occur.

The present disclosure provides techniques for a memory device to dynamically self-generate a reference voltage 315 that is specific to the memory device and/or operating conditions or characteristics of the memory device. For example, the memory device may generate the reference voltage 315 based on a logic value of multiple memory cells, which may relate to distributions 305-a and 305-b. Such a reference voltage 315 may be referred to as a self-reference voltage and may maintain a maximum read window (e.g., a maximum reference voltage window 310 between the two distributions 305) because the reference voltage 315 may shift in a correlated manner to the shifting of distributions 305-a and 305-b.

The memory device may generate the self-reference voltage based on having previously balanced a codeword of bits stored at the memory device. The codeword may include a quantity of bits that may each represent a binary value, and may each be associated with a respective logic state stored at a memory cell. A codeword may thus include multiple bits which correspond to logic states associated with respective memory cells of a set of multiple memory cells. In order to balance the codeword, the memory device may balance, or quasi-balance, the bits (e.g., balance a quantity of 0s and 1s) associated with the codeword. Balancing techniques are further described herein with reference to FIG. 4. Based on the balancing, the memory device may write values to the memory cells such that the codeword includes an equal, or nearly equal, quantity of 1s and 0s. When accessing the memory cells associated with the codeword for a read operation, the memory device may average the voltages associated with each memory cell (e.g., sensed from each memory cell), which may generate a reference voltage 315 between (e.g., halfway between, or nearly so) distribution 305-a and 305-b (e.g., which may also move with distribution 305-a and 305-b). Such a reference voltage 315 may account for fluctuations in voltages associated with memory cells due to usage, operating conditions or characteristics, manufacturing differences, defects, or other factors. The memory device may then use the generated reference voltage 315 to read each memory cell storing the codeword bits, for example, based on comparing the reference voltage 315 with the respective, sensed voltage associated with each memory cell.

Figure 4:
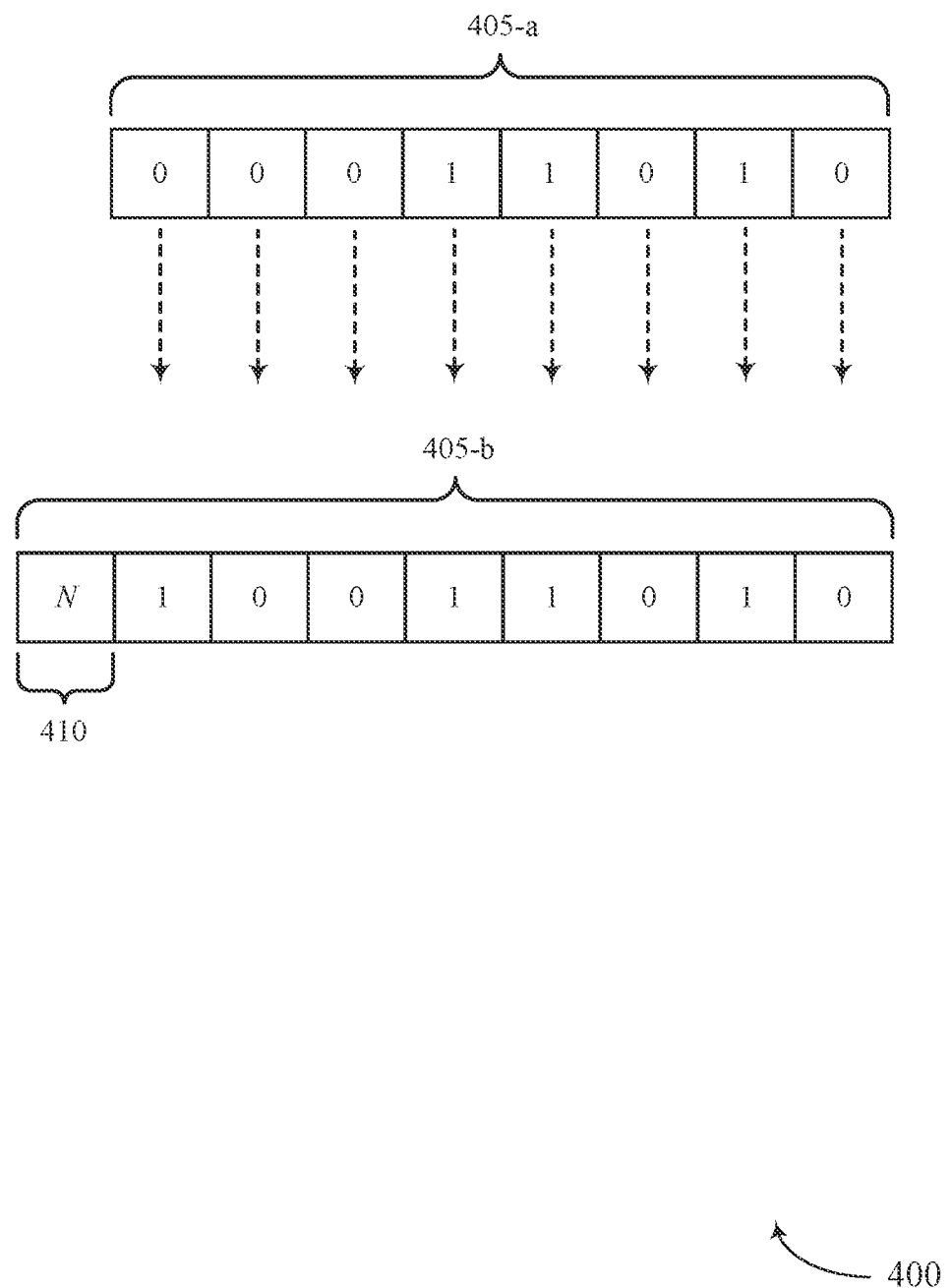
FIG. 4 illustrates an example of a bit balancing scheme that supports memory cell sensing using an averaged reference voltage in accordance with examples as disclosed herein.

FIG. 4 illustrates an example of a bit balancing scheme 400 that supports memory cell sensing using an averaged reference voltage in accordance with examples as disclosed herein. Bit balancing scheme 400 may include codewords 405-a and 405-b, which may be examples of codewords as described with reference to FIG. 3. As described herein, a codeword 405 may include a quantity of bits that may each be stored at a respective memory cell of a memory device. A codeword 405 may include multiple bits which may each correspond to a respective logic state stored at a respective memory cell. As described with reference to FIG. 3, the memory device may balance, or quasi-balance, the logic states within a codeword 405, for example, in order to support obtaining an averaged self-reference voltage when reading values from the memory cells in which the bits of the codeword 405 are stored.

A codeword 405 (e.g., a data packet, data burst) may include N bits, where each of the N bits may represent a logic value (e.g., one of a first logic value or a second logic value). A weight may be assigned to a codeword 405 based on a quantity of bits included in the codeword 405 that have a first logic value (e.g., 1). In some cases, a weight of a codeword 405 may represent a ratio of a first quantity of bits (e.g., and associated memory cells) having a first logic value to a second quantity of bits (e.g., and associated memory cells) having a second logic value. A codeword 405 that has a same quantity of bits having the first logic value and a second logic value (e.g., 0) may be referred to as a "balanced data packet" or balanced codeword," and a codeword 405 having a specific weight (e.g., a weight of N/2 or some other specific target weight) may be more generally referred to as a "constant weight data packet" or "constant weight codeword." As described herein, a codeword 405 may be encoded to have a specific target weight (e.g., to be a balanced codeword 405 or another type of constant weight codeword 405) or to have a weight that is within a target weight range. Thus, an encoded codeword 405 as used herein may broadly refer to a codeword 405 that is a balanced codeword 405, a constant weight codeword 405, or a codeword 405 with a weight within a target weight range. A process by which a codeword 405-a is encoded to achieve a weight equal to a target weight or within a target weight range may broadly be referred to herein as a balancing process, even if the resulting encoded codeword 405-b is not itself strictly balanced, as such a process may nevertheless reduce a difference between a quantity of bits having one logic value and a quantity of bits having another logic value within the codeword 405-b.

For example, the memory device may invert one or more bits of a codeword 405-a to obtain a balanced or quasi-balanced codeword 405 (e.g., according to an algorithm such as a Knuth Algorithm or a variation thereof as described herein). For example, codeword 405-a may include 8 bits. Codeword 405-a may include 3 bits corresponding to a first logic value of 1 and 5 bits corresponding to a second logic value of 0, such that codeword 405-a may not be an example of a balanced codeword 405 (e.g., may be unbalanced). In order to balance, or quasi-balance, codeword 405-a, the memory device may invert (e.g., flip) one or more bits of the codeword 405-a (e.g., flip a first bit from a logic 0 to a logic 1). The memory device may add one or more additional bits (e.g., encoding bit 410) to the codeword 405-a that indicates the one or more inversions. Codeword 405-b may result from inverting a first bit of codeword 405-a and adding encoding bit 410. Codeword 405-b may be an example of a balanced codeword 405 (e.g., based on having 4 bits with a value of 1 and 4 bits with a value of 0). A quasi-balanced codeword 405 may not include an equal quantity of logic 1s and logic 0s, but may include an almost equal quantity of logic 1s and logic 0s. For example, a quasi-balanced codeword 405 may include a specific quantity of logic is or of logic 0s, and may also be referred to as a constant weight codeword 405.

In some cases, as part of an encoding process to obtain an encoded codeword 405-b, the memory device may test different inversion possibilities for a codeword 405-a. That is, for codeword 405-a, the memory device 110 may compute weights for a set of possible encoded codewords 405 that may be derived from codeword 405-a. Each of the possible encoded codewords 405 may include a different combination of inverted bits and be referred to as a "hypothesis." To test all of the possible encoded codewords 405 for codeword 405-a and to ensure that target weight or weight range will be obtained, the memory device may compute up to $2^N$ weights for up to $2^N$ different encoded codewords 405 derived from codeword 405-a—for example, the memory device may test $2^N$ different hypotheses.

After identifying a hypothesis that is associated with a target weight or weight range, the memory device may invert the corresponding bits of codeword 405-a to yield the encoded codeword 405-b. The memory device may store the encoded codeword 405-b (e.g., a balanced or quasi-balanced codeword 405) in a set of multiple memory cells (e.g., in place of an originally received codeword 405, such as received from a host device), where each bit of codeword 405-b may correspond to a respective memory cell. To support reconstruction of the original codeword 405-a, the memory device may generate and store an indication of which bits of codeword 405-a were inverted to form the encoded codeword 405-b (e.g., one or more encoding bits 410). Such an indication may be appended to the encoded codeword 405-b as described herein. In some cases, $\log_2(2^N)=N$ encoding bits 410 may be used to indicate which bits of codeword 405-a were inverted during the encoding process.

In some cases, an encoding process to obtain an encoded codeword 405-b may add latency to the process for storing data—e.g., as a result of testing up to $2^N$ different hypotheses. To reduce the added latency, the potential number of hypotheses tested by memory device may be reduced. In one option for reducing the number of tested hypotheses, the memory device may test a set of hypotheses that are derived in accordance with a sequential and cumulative (or persistent) inversion of each bit of codeword 405-a until a hypothesis that achieves a target weight (e.g., a weight of N/2 or ½) is determined. That is, the memory device 110 may compute a first weight associated with a first hypothesis assuming a first bit of codeword 405-a is inverted, a second weight associated with a second hypothesis assuming the first bit and a second bit of codeword 405-a are inverted, and so on, up to an Nth weight associated with a final hypothesis assuming all of the bits of codeword 405-a are inverted. Thus, an encoding process that uses bit-by-bit inversion may test N+1 hypotheses (rather than $2^N$ hypotheses) and use $\lceil \log_2(N+1) \rceil$ encoding bits (rather than N encoding bits) to indicate which bits of codeword 405-a were inverted during the encoding process. The sequential and cumulative inversion of each bit may be associated with or represent a Knuth balancing algorithm. For example, as illustrated in the example of FIG. 4, inverting the very first bit of the codeword 405-a may result in a balanced codeword 405-b, and N encoding bits 410 may be stored to indicate which one or more bits of the balanced codeword 405-b were inverted relative to the original (e.g., unbalanced, source) codeword 405-a. For example, encoding bits 410 may represent a field that includes multiple bits, such as three (3) bits in the example of FIG. 4 as the original codeword 405-a includes eight (8) bits.

In another option for reducing the number of tested hypotheses, the memory device may divide codeword 405-a into $r_1$ segments and test all of the possible combinations of inverted segments of codeword 405-a until a hypothesis that achieves a target weight range is determined. The target weight range may be represented as $$\left[\frac{N}{2}, \frac{N}{2}\left(1 + \frac{1}{r_1}\right)\right]$$

or, alternatively, as $$\left[\frac{1}{2}, \frac{1}{2}\left(1 + \frac{1}{r_1}\right)\right]$$

after normalization. Thus, an encoding process that uses segmented inversion may test $2^{r_1}$ hypotheses (rather than $2^N$ hypotheses) and use $\log_2(2^{r_1})=r_1$ encoding bits (rather than N encoding bits) to indicate which segments of codeword 405-a were inverted during the encoding process, where N may be greater than $r_1$. In some cases, each of the $r_1$ segments may include $n_1$ bits, where $$n_1 = \frac{N}{r_1}.$$

In a third option for reducing the number of tested hypothesis, which may be associated with decreased latency and encoding overhead relative to the first and second options, the memory device may divide codeword 405-a into $r_2$ segments and test a set of hypotheses that are derived in accordance with a sequential and cumulative inversion of each segment of codeword 405-a until a hypothesis that achieves a target weight range is determined. For example, the memory device may compute a first weight associated with a first hypothesis assuming a first segment of codeword 405-a is inverted, a second weight associated with a second hypothesis assuming the first segment and a second segment of codeword 405-a are inverted, a third weight associated with a third hypothesis assuming the first, second, and third segments of codeword 405-a are inverted, and so on—up to an $r_2$th weight associated with a final hypothesis assuming all of the segments of codeword 405-a are inverted. Thus, $r_2+1$ hypotheses may be tested (including a hypothesis that assumes no segments are inverted) and $\lceil \log_2(r_2+1) \rceil$ encoding bits may be used to indicate which segments of codeword 405-a were inverted during the encoding process. In some cases, each of the $r_2$ segments may include $n_2$ bits, where $$n_2 = \frac{N}{r_2}.$$

In other cases, each of the $r_2$ segments may include a varying number of bits.

After identifying an inversion possibility for codeword 405-a (e.g., equal to a target weight or within a target weight range), the corresponding bits of codeword 405-a may be inverted. For example, a first bit of codeword 405-a may be flipped or inverted from a logic 0 to a logic 1, which may balance codeword 405-a. One or more encoding bits 410 may be added to codeword 405-a, resulting in codeword 405-b, which may be stored in a memory array (e.g., each bit stored in a respective memory cell of the array) in a place of the original codeword 405-a. As such, the set of memory cells storing the bits of the codeword 405-b may satisfy a threshold ratio of a first quantity of memory cells storing a first logic state to a second quantity of memory cells storing a second logic state (e.g., where the threshold ratio may be a target weight or a target weight range of codeword 405-b).

The following table (e.g., Table 1) may include examples of target weight ranges for varying codeword sizes and varying quantities of inverted bits within the codewords 405. In Table 1, "Page Weight" may refer to the weight of a data packet or the weight of a codeword 405. As shown in Table 1, inverting 8 bits for a 256-bit (e.g., 32-byte or 32B) codeword 405 may result in 128 to 138 bits of the codeword having a logic value of 1, which may result in the codeword 405 having a weight (e.g., normalized weight, percentage weight) roughly between 50 percent and 54 percent.

TABLE 1

| | Page Weights for Different Quantities of Inversion Bits | | | | | | | | | |
|---|---|---|---|---|---|---|---|---|---|---|
| Inversion Bits K | Page Weight [approximate %] | | Page Weight [bit] | | | | | | | |
| | | | 16 B | | 32 B | | 64 B | | 128 B | |
| | Min | Max | Min | Max | Min | Max | Min | Max | Min | Max |
| 1 | 50% | 100% | 64 | 128 | 218 | 256 | 256 | 512 | 512 | 1024 |
| 2 | 50% | 75% | 64 | 96 | 128 | 192 | 256 | 384 | 512 | 768 |
| 3 | 50% | 67% | 64 | 85 | 128 | 170 | 256 | 341 | 512 | 682 |
| 4 | 50% | 63% | 64 | 80 | 128 | 160 | 256 | 320 | 512 | 640 |
| 5 | 50% | 60% | 64 | 77 | 128 | 154 | 256 | 307 | 512 | 614 |
| 6 | 50% | 58% | 64 | 75 | 128 | 149 | 256 | 298 | 512 | 597 |
| 7 | 50% | 56% | 64 | 72 | 128 | 144 | 256 | 287 | 512 | 574 |
| 8 | 50% | 54% | 64 | 69 | 128 | 138 | 256 | 276 | 512 | 553 |

In some cases, codeword 405-b may further include padding bits, which may be referred to as a padding segment. For example, the padding bits may support obtaining a specific target weight for codeword 405-a (e.g., when inversion is done on a per-segment basis), by adding a specific quantity of logic 0s or logic is to codeword 405-a (e.g., resulting in codeword 405-b). The padding bits may include a quantity of bits (e.g., "dummy bits" or "filler bits") to support satisfying a target weight or weight range for codeword 405-a (e.g., between 49% and 51% or between a weight of 128 and 135). The padding bits may thus be used to adjust (e.g., fine-tune) the weight of codeword 405 to equal a target weight or weight range. In some cases "padding bits" may refer to bits that may not be protected by one or more error correction codes (ECCs) associated with a codeword 405.

As described herein, the memory device may balance a codewords 405 to generate a self-reference voltage when reading the bits, or logic states, of the codeword. As such, a reference voltage 315 as described with reference to FIG. 3 may be an example of a reference voltage generated from a balanced, or quasi-balanced, codeword 405. When accessing the memory cells associated with the codeword, the memory device may perform an averaging operation as described herein (e.g., with reference to FIG. 5), which may generate a reference voltage for the memory cells.

Figure 5:
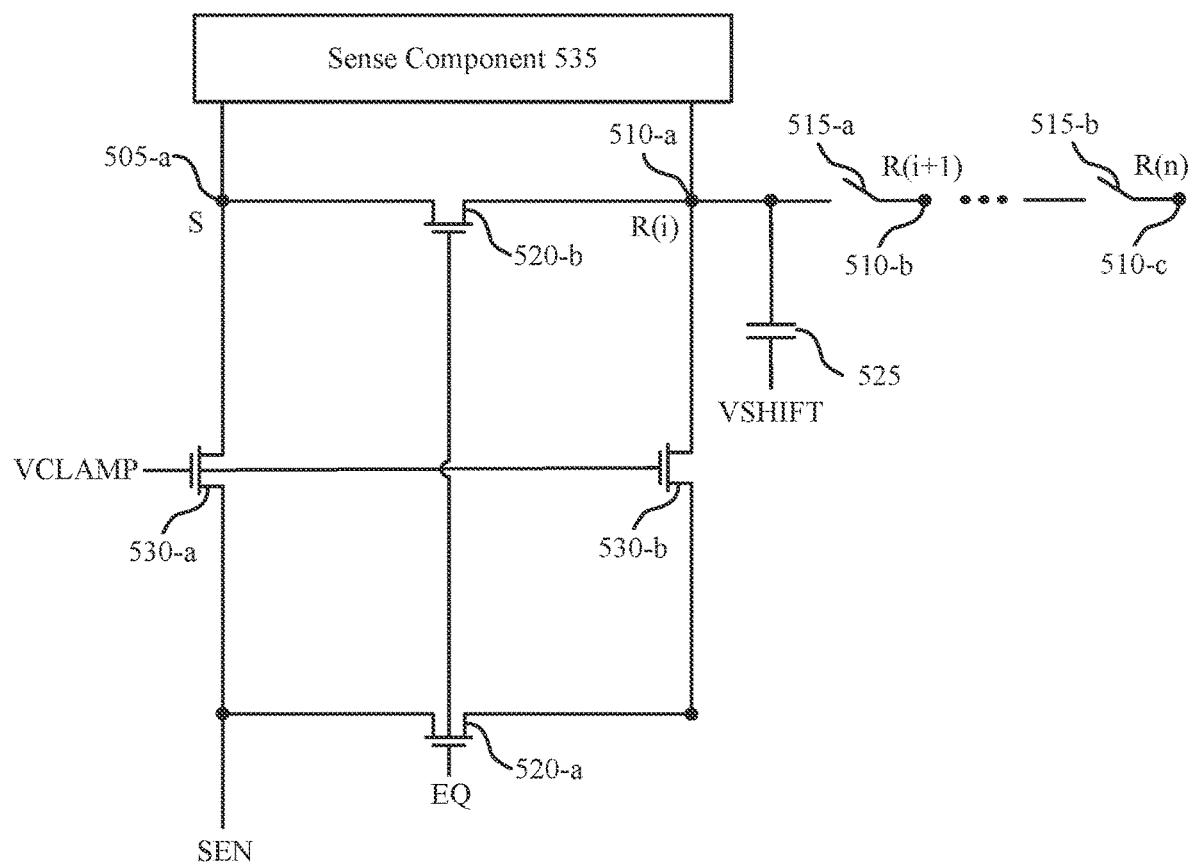
FIG. 5 illustrates an example of a circuit that supports memory cell sensing using an averaged reference voltage in accordance with examples as disclosed herein.

FIG. 5 illustrates an example of a circuit 500 that supports memory cell sensing using an averaged reference voltage in accordance with examples as disclosed herein. Circuit 500 may be included in a memory device and may include a sense component 535, which may be used to sense a logic state of one or more memory cells, for example, as described with reference to FIG. 2 and sense component 250. In some cases, the sense component 250 may represent multiple sense components 535. For example, each sense component 535 may be operable to sense a logic state of one memory cell, while the sense component 250 may be operable to sense a logic state of multiple memory cells (e.g., of each memory cell storing a bit of a codeword). The sense component 535 may be or include an example of a sense amplifier, a differential amplifier, a latch, or any other component operable to compare two voltages, or any combination thereof.

A logic state stored at a memory cell associated with sense component 535 may be sensed, or read, using sense component 535, and using a reference voltage corresponding to a codeword associated with the memory cell (e.g., the memory cell stores a logic value or bit of the codeword). The codeword may, for example, be a balanced or quasi-balanced codeword as described herein. A charge stored at the memory cell (e.g., and representative of the logic state of the cell) may be accessible using a bit line or a digit line as described with reference to FIG. 2. For example, during a read operation, the memory cell may be coupled with the digit line and may transfer its charge to the digit line, or may receive charge from the digit line, such that a charge of the digit line (e.g., and a corresponding voltage) may be indicative of the logic state of the memory cell. The digit line may include or be coupled with a SEN node (e.g., sense node), which may hold the charge (e.g., and associated voltage) indicative of the logic state of the memory cell.

The SEN node may be coupled with an S node (e.g., another sense node) which may be referred to as a sense node 505-a (e.g., a first node). As such, during a read operation, the charge and the voltage associated with the logic state of the memory cell may be shared with sense node 505-a. In order to support generating a reference voltage for the codeword associated with the memory cell, the SEN node and the sense node 505-a may also be coupled with an R node, which may be referred to as a reference node 510-a (e.g., a second node). For example, switching components 520-a and 520-b (e.g., transistors) may be activated (e.g., by asserting an EQ signal or voltage) to couple the SEN node and sense node 505-a with reference node 510-a (e.g., after precharging a plate line and activating a word line associated with the memory cell).

Accordingly, the charge and the voltage associated with the logic state of the memory cell may also be shared with reference node 510-a. For example, the charge may be split between sense node 505-a and reference node 510-a, and sense node 505-a and reference node 510-a develop a same voltage (e.g., a sensed voltage associated with the shared charge). The voltage and the charge may be maintained at sense node 505-a and reference node 510-a (e.g., at least in part) based on a parasitic capacitance of the associated lines (e.g., a parasitic capacitance of the digit line).

Once the voltage (e.g., sensed voltage) has been developed at sense node 505-a and reference node 510-a, switching components 520-a and 520-b may be deactivated (e.g., by deasserting the EQ signal) to isolate (e.g., electrically isolate) sense node 505-a from reference node 510-a. Thus, the voltage (e.g., sensed voltage) representative of the logic state of the memory cell may be developed at both sense node 505-a and reference node 510-a. Similar techniques may be performed concurrently (e.g., at least partially overlapping) or sequentially for each memory cell associated with the codeword (e.g., for each memory cell of a set of multiple memory cells storing the bits of the codeword).

For example, each memory cell (e.g., a digit line of each memory cell) may be coupled with a respective sense node 505 and reference node 510 (e.g., R nodes from R(i) to R(n), which may include reference nodes 510-b and 510-c), such that the respective sense node 505 and reference node 510 may develop a respective voltage (e.g., a respective sensed voltage) indicative of a respective logic state of the corresponding memory cell and then may be decoupled, or isolated, from each other. As such, each reference node 510 (e.g., reference nodes 510-b and 510-c, among others) may develop a respective voltage indicative of the logic state of the associated memory cell.

After developing the respective voltages at each respective sense node 505 and reference node 510, the memory device may activate a set of multiple switching components 515 (e.g., transistors). The switching components 515 may be operable to couple (e.g., when activated) each reference node 510 to each other reference node 510. For example, switching component 515-a may couple reference nodes 510-a and 510-b, a second switching component 515 may couple reference node 510-b with another reference node 510, and so on until switching component 515-b may couple reference node 510-c with the other reference nodes 510 (e.g., by coupling reference node 510-c with an immediately preceding reference node 510). By coupling (e.g., shorting) the reference nodes 510 of the codeword together, the charge and voltage associated with each reference node 510 may be averaged or shared, which may generate an average voltage across the codeword. Because the codeword is balanced, or quasi-balanced, the average voltage may be between (e.g., halfway between) a first logic state and a second logic state and may be used as, or referred to as, a reference voltage.

In some cases, the reference voltage may be shifted, for example, based on one or more qualities or characteristics of the memory device (e.g., as known or set during a fabrication or testing stage). In such cases, a shifting voltage (VSHIFT) may be applied to one or more capacitors 525, which may be coupled with the reference nodes 510. In some cases, one capacitor 525 may be coupled with the reference nodes 510, while in some other cases, each reference node 510 may be coupled with a respective capacitor 525, among other examples. Applying the shifting voltage (e.g., increasing or decreasing VSHIFT) may cause the reference voltage to increase or decrease by a corresponding amount (e.g., as determined during fabrication and/or testing), which may fine-tune the reference voltage, or may increase an accuracy of the reference voltage. For example, the reference voltage may be shifted from a first voltage to a second voltage based on applying the shifting voltage to the one or more capacitors 525 (e.g., due to capacitive coupling between one or more of the reference nodes 510 and a node corresponding to VSHIFT).

After generating the reference voltage (e.g., and in some cases, shifting the reference voltage), the reference nodes 510 may remain coupled, or may be isolated. In a first example, each of the reference nodes 510 may be maintained coupled with each of the other reference nodes 510 (e.g., via the switching components 515) for a remainder of the read operation. In a second example, each of the reference nodes 510 may be decoupled or isolated from each of the other reference nodes 510 after developing the reference voltage, for example, by deactivating the switching components 515. In such cases, each of the reference nodes 510 may remain at a same voltage as each of the other reference nodes 510 (e.g., may remain at the reference voltage), even though the reference nodes 510 are decoupled.

The respective sense component 535 for each memory cell may receive inputs from the respective sense node 505 and reference node 510 associated with the corresponding memory cell. For example, the sense component 535 may receive an input of the sensed voltage from sense node 505-*a* (e.g., an input of the voltage sensed from the memory cell), and may receive an input of the reference voltage from reference node 510-*a*. Similar voltages may be input to sense components 535 corresponding to other memory cells storing bits of the codeword (e.g., from respective sense nodes 505 and reference nodes 510). The sense component 535 (e.g., and the other sense components 535) may compare the sensed voltage with the reference voltage for the memory cell, and may determine a logic state of the memory cell based on comparing the sensed voltage with the reference voltage. For example, if the sensed voltage is above the reference voltage, the sense component 535 may determine that the memory cell stores the first logic state, or if the sensed voltage is below the reference voltage, the sense component 535 may determine that the memory cell stores the second logic state (e.g., or vice versa). As described herein, the reference voltage may be input to the sense component 535 while the reference nodes 510 are coupled together, or while the reference nodes 510 are isolated from each other.

The memory device may further include a respective transistor 530 associated with each sense node 505, as well as a transistor 530 associated with each reference node 510, which may be referred to as clamp transistors. For example, sense node 505-*a* may be coupled with the SEN node via a transistor 530-*a* and reference node 510-*a* may be coupled with the SEN node via a transistor 530-*b*. Similar, respective transistors 530 may be coupled with each other sense node 505 and reference node 510 of the memory device. Each transistor 530 may be operable to maintain the respective sense node 505, or the respective reference node 510, below a threshold voltage (e.g., may be operable to "clamp" the voltage below a certain level, or prevent the voltage from increasing above that certain level). The transistors 530 may be activated, or operable, by a clamp voltage (VCLAMP) applied to a gate of the transistors. While applying VCLAMP, a voltage of a first node of a respective transistor 530 may be limited to be below the threshold voltage (e.g., even when a voltage of a second node of the transistor is above the threshold voltage).

For example, a transistor 530 may have a first node coupled with a sense node 505 (or reference node 510) and a second node coupled with a SEN node, which may be at a voltage that corresponds to the logic state of the associated memory cell. While the voltage of the SEN node (e.g., of the second node of the transistor 530) stays at or below the threshold voltage, the voltage of the sense node 505 (or reference node 510) (e.g., the first node of the transistor 530) may be equal (substantially equal) to the voltage of the SEN node. However, if the voltage of the SEN node (e.g., of the second node of the transistor 530) exceeds the threshold voltage, the voltage of the sense node 505 (or reference node 510) (e.g., the first node of the transistor 530) may remain at the threshold voltage. Such techniques may prevent an excessive voltage from being developed on the corresponding sense node 505 and reference node 510, which may limit outlying voltages (e.g., excessively high voltages) from being used to determine the reference voltage, or which may limit excessive voltage application to the sense component 535.

Based on using the averaged reference voltage (e.g., a self-reference voltage for the stored codeword), the memory device may read logic values from memory cells using a reference voltage that tracks usage and wear characteristics of the memory device and its memory cells (e.g., as described with reference to FIG. 3). For example, the reference voltage may provide plate voltage tracking, digit line topology tracking, array noise tracking, and row address strobe phase propagation topology tracking (e.g., if the reference voltage is limited to a tile level or lower), and may also track or account for an average thin film transistor leakage. The reference voltage may also support a sense component (e.g., a latch) with a low input offset, and may support the use of relatively faster, smaller (e.g., smaller magnitude), and fewer control signals for reading logic value stored at a memory cell.

Figure 6:
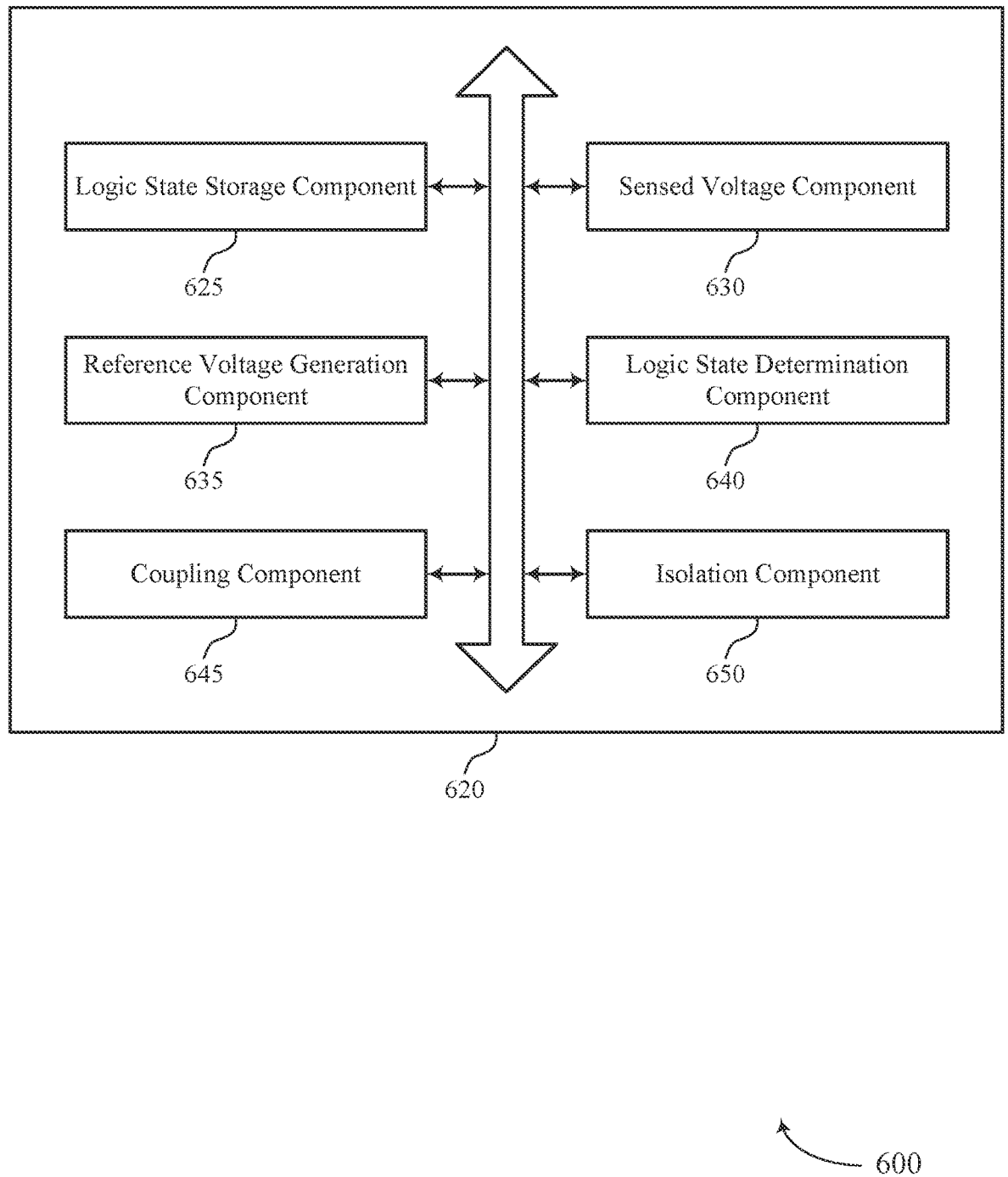
FIG. 6 shows a block diagram of a memory device that supports memory cell sensing using an averaged reference voltage in accordance with examples as disclosed herein.

FIG. 6 shows a block diagram 600 of a memory device 620 that supports memory cell sensing using an averaged reference voltage in accordance with examples as disclosed herein. The memory device 620 may be an example of aspects of a memory device as described with reference to FIGS. 1 through 5. The memory device 620, or various components thereof, may be an example of means for performing various aspects of memory cell sensing using an averaged reference voltage as described herein. For example, the memory device 620 may include a logic state storage component 625, a sensed voltage component 630, a reference voltage generation component 635, a logic state determination component 640, a coupling component 645, an isolation component 650, or any combination thereof. Each of these components may communicate, directly or indirectly, with one another (e.g., via one or more buses).

The logic state storage component 625 may be configured as or otherwise support a means for storing a respective logic state at each of a plurality of memory cells, where the logic states of the plurality of memory cells satisfy a threshold ratio of a first quantity of memory cells of the plurality storing a first logic state to a second quantity of memory cells of the plurality storing a second logic state. The sensed voltage component 630 may be configured as or otherwise support a means for developing, for each memory cell of the plurality, a respective sensed voltage at a respective first node and at a respective second node each associated with the memory cell, where each sensed voltage is representative of the respective logic state of the associated memory cell. The reference voltage generation component 635 may be configured as or otherwise support a means for generating a reference voltage for the plurality of memory cells based at least in part on coupling each of the second nodes of the plurality of memory cells to each other of the second nodes. The logic state determination component 640 may be configured as or otherwise support a means for determining a logic state of a first memory cell of the plurality based at least in part on the reference voltage and a first sensed voltage associated with the first memory cell.

In some examples, the coupling component 645 may be configured as or otherwise support a means for coupling, for each memory cell of the plurality, the respective first node with the respective second node, where developing the respective sensed voltage for each memory cell of the plurality is based at least in part on coupling the respective first node with the respective second node. In some examples, the isolation component 650 may be configured as or otherwise support a means for isolating, for each memory cell of the plurality, the respective first node from the respective second node after developing the respective sensed voltage for each memory cell of the plurality, where generating the reference voltage is based at least in part on isolating the respective first node from the respective second node. In some examples, a single component may function as both the coupling component 645 and the isolation component 650.

In some examples, to support determining the logic state of the first memory cell, the logic state determination component 640 may be configured as or otherwise support a means for comparing the first sensed voltage with the reference voltage, where the first sensed voltage is developed at the respective first node associated with the first memory cell.

In some examples, the coupling component 645 may be configured as or otherwise support a means for maintaining each of the second nodes of the plurality of memory cells coupled to each other of the second nodes while determining the logic state of the first memory cell. In some examples, the isolation component 650 may be configured as or otherwise support a means for isolating each of the second nodes of the plurality of memory cells from each other of the second nodes before determining the logic state of the first memory cell.

In some examples, to support generating the reference voltage, the reference voltage generation component 635 may be configured as or otherwise support a means for shifting the reference voltage from a first voltage to a second voltage after coupling each of the second nodes of the plurality of memory cells to each other of the second nodes, where determining the logic state of the first memory cell is based at least in part on the second voltage.

In some examples, the logic states of the plurality of memory cells may satisfy the threshold ratio based at least in part on the first quantity being within a first range of values and the second quantity being within a second range of values. In some examples, the threshold ratio may be the first quantity being equal to the second quantity.

Figure 7:
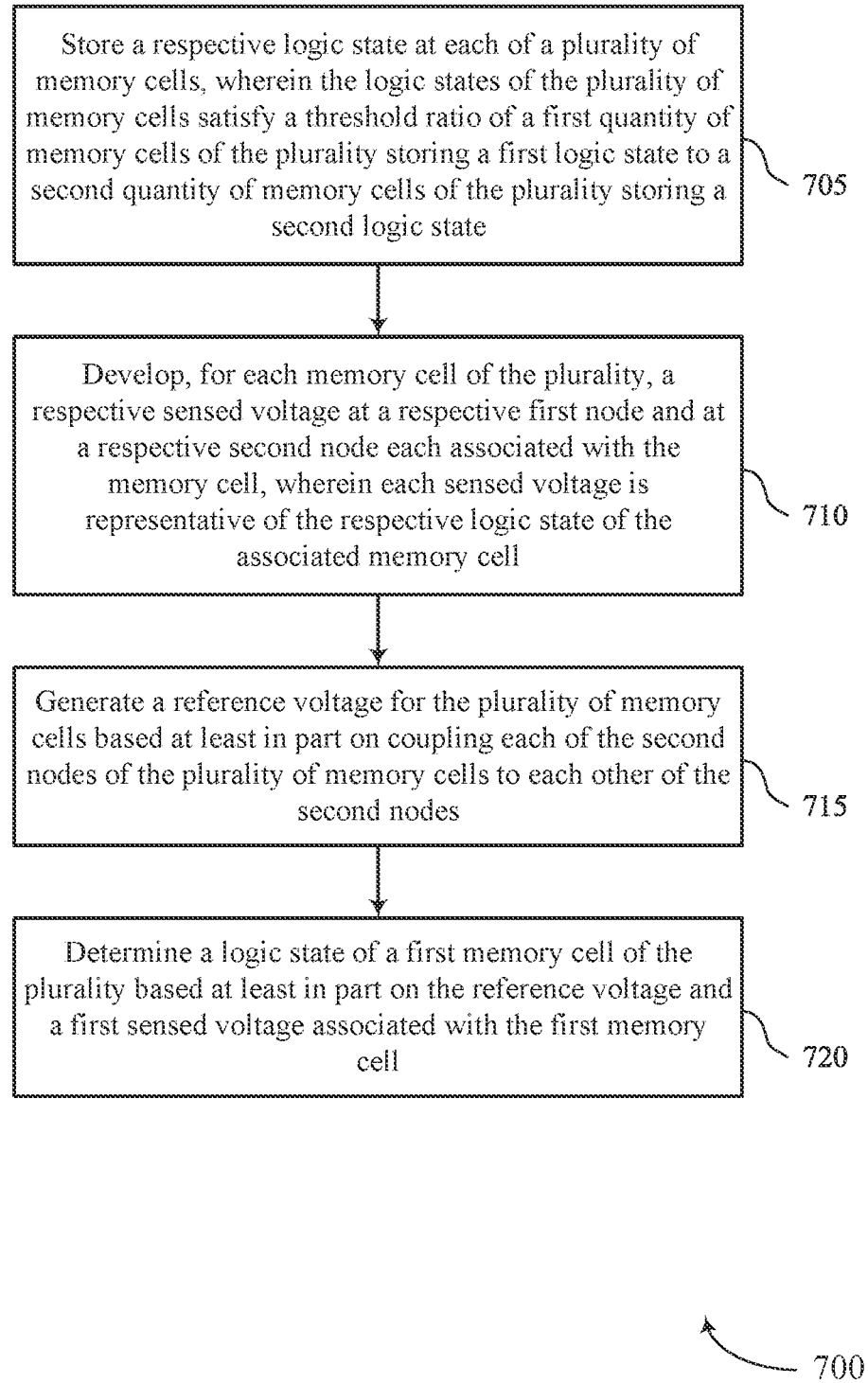
FIG. 7 shows a flowchart illustrating a method or methods that support memory cell sensing using an averaged reference voltage in accordance with examples as disclosed herein.

FIG. 7 shows a flowchart illustrating a method 700 that supports memory cell sensing using an averaged reference voltage in accordance with examples as disclosed herein. The operations of method 700 may be implemented by a Memory Device or its components as described herein. For example, the operations of method 700 may be performed by a Memory Device as described with reference to FIGS. 1 through 6. In some examples, a Memory Device may execute a set of instructions to control the functional elements of the device to perform the described functions. Additionally or alternatively, the Memory Device may perform aspects of the described functions using special-purpose hardware.

At 705, the method may include storing a respective logic state at each of a plurality of memory cells, where the logic states of the plurality of memory cells satisfy a threshold ratio of a first quantity of memory cells of the plurality storing a first logic state to a second quantity of memory cells of the plurality storing a second logic state. The operations of 705 may be performed in accordance with examples as disclosed herein. In some examples, aspects of the operations of 705 may be performed by a logic state storage component 625 as described with reference to FIG. 6.

At 710, the method may include developing, for each memory cell of the plurality, a respective sensed voltage at a respective first node and at a respective second node each associated with the memory cell, where each sensed voltage is representative of the respective logic state of the associated memory cell. The operations of 710 may be performed in accordance with examples as disclosed herein. In some examples, aspects of the operations of 710 may be performed by a sensed voltage component 630 as described with reference to FIG. 6.

At 715, the method may include generating a reference voltage for the plurality of memory cells based at least in part on coupling each of the second nodes of the plurality of memory cells to each other of the second nodes. The operations of 715 may be performed in accordance with examples as disclosed herein. In some examples, aspects of the operations of 715 may be performed by a reference voltage generation component 635 as described with reference to FIG. 6.

At 720, the method may include determining a logic state of a first memory cell of the plurality based at least in part on the reference voltage and a first sensed voltage associated with the first memory cell. The operations of 720 may be performed in accordance with examples as disclosed herein. In some examples, aspects of the operations of 720 may be performed by a logic state determination component 640 as described with reference to FIG. 6.

In some examples, an apparatus as described herein may perform a method or methods, such as the method 700. The apparatus may include, features, circuitry, logic, means, or instructions (e.g., a non-transitory computer-readable medium storing instructions executable by a processor), or any combination thereof for performing the following aspects of the present disclosure:

Aspect 1: The apparatus, including features, circuitry, logic, means, or instructions, or any combination thereof for storing a respective logic state at each of a plurality of memory cells, where the logic states of the plurality of memory cells satisfy a threshold ratio of a first quantity of memory cells of the plurality storing a first logic state to a second quantity of memory cells of the plurality storing a second logic state; developing, for each memory cell of the plurality, a respective sensed voltage at a respective first node and at a respective second node each associated with the memory cell, where each sensed voltage is representative of the respective logic state of the associated memory cell; generating a reference voltage for the plurality of memory cells based at least in part on coupling each of the second nodes of the plurality of memory cells to each other of the second nodes: and determining a logic state of a first memory cell of the plurality based at least in part on the reference voltage and a first sensed voltage associated with the first memory cell.

Aspect 2: The apparatus of aspect 1, further including operations, features, circuitry, logic, means, or instructions, or any combination thereof for coupling, for each memory cell of the plurality, the respective first node with the respective second node, where developing the respective sensed voltage for each memory cell of the plurality is based at least in part on coupling the respective first node with the respective second node.

Aspect 3: The apparatus of aspect 2, further including operations, features, circuitry, logic, means, or instructions, or any combination thereof for isolating, for each memory cell of the plurality, the respective first node from the respective second node after developing the respective sensed voltage for each memory cell of the plurality, where generating the reference voltage is based at least in part on isolating the respective first node from the respective second node.

Aspect 4: The apparatus of any of aspects 1 through 3 where operations, features, circuitry, logic, means, or instructions, or any combination thereof for determining the logic state of the first memory cell, further include operations, features, circuitry, logic, means, or instructions, or any combination thereof for comparing the first sensed voltage with the reference voltage, where the first sensed voltage is developed at the respective first node associated with the first memory cell.

Aspect 5: The apparatus of any of aspects 1 through 4, further including operations, features, circuitry, logic, means, or instructions, or any combination thereof for maintaining each of the second nodes of the plurality of memory cells coupled to each other of the second nodes while determining the logic state of the first memory cell.

Aspect 6: The apparatus of any of aspects 1 through 5, further including operations, features, circuitry, logic, means, or instructions, or any combination thereof for isolating each of the second nodes of the plurality of memory cells from each other of the second nodes before determining the logic state of the first memory cell.

Aspect 7: The apparatus of any of aspects 1 through 6 where operations, features, circuitry, logic, means, or instructions, or any combination thereof for generating the reference voltage, further includes operations, features, circuitry, logic, means, or instructions, or any combination thereof for shifting the reference voltage from a first voltage to a second voltage after coupling each of the second nodes of the plurality of memory cells to each other of the second nodes, where determining the logic state of the first memory cell is based at least in part on the second voltage.

Aspect 8: The apparatus of any of aspects 1 through 7, wherein the logic states of the plurality of memory cells satisfy the threshold ratio based at least in part on the first quantity being within a first range of values and the second quantity being within a second range of values.

Aspect 9: The apparatus of any of aspects 1 through 8, wherein the threshold ratio is the first quantity being equal to the second quantity.

It should be noted that the methods described herein are possible implementations, and that the operations and the steps may be rearranged or otherwise modified and that other implementations are possible. Furthermore, portions from two or more of the methods may be combined.

An apparatus is described. The following provides an overview of aspects of the apparatus as described herein:

Aspect 10: An apparatus, including: a plurality of memory cells each operable to store a respective logic state; a balancing component operable to configure the logic states of the plurality of memory cells to satisfy a threshold ratio of a first quantity of memory cells of the plurality storing a first logic state to a second quantity of memory cells of the plurality storing a second logic state; a plurality of first nodes and a plurality of second nodes each couplable with a respective memory cell of the plurality of memory cells and each operable to be set to a respective sensed voltage representative of the respective logic state of the respective memory cell, where the plurality of second nodes are each couplable with a respective first node of the plurality of first nodes; a plurality of switching components operable to generate a reference voltage for the plurality of memory cells based at least in part on coupling each of the second nodes to each other of the second nodes; and a sense component operable to determine a logic state of a first memory cell of the plurality based at least in part on the reference voltage and a first sensed voltage associated with the first memory cell.

Aspect 11: The apparatus of aspect 10, further including: a second plurality of switching components each operable to couple, for a respective memory cell of the plurality, a respective first node with a respective second node, where setting the respective sensed voltage at each of the plurality of second nodes is based at least in part on coupling the respective first node with the respective second node.

Aspect 12: The apparatus of aspect 11, where each switching component of the second plurality is further operable to: isolate, for each memory cell of the plurality, the respective first node from the respective second node after setting the respective second node to the respective sensed voltage, where generating the reference voltage is based at least in part on isolating the respective first node from the respective second node.

Aspect 13: The apparatus of any of aspects 10 through 12, where the sense component is further operable to: receive the first sensed voltage from a respective first node associated with the first memory cell; receive the reference voltage from a respective second node associated with the first memory cell; and compare the first sensed voltage with the reference voltage, where determining the logic state of the first memory cell is based at least in part on the comparing.

Aspect 14: The apparatus of any of aspects 10 through 13, where the plurality of switching components is further operable to: maintain each of the second nodes coupled to each other of the second nodes while determining the logic state of the first memory cell.

Aspect 15: The apparatus of any of aspects 10 through 14, where the plurality of switching components is further operable to: isolate each of the second nodes from each other of the second nodes before determining the logic state of the first memory cell.

Aspect 16: The apparatus of any of aspects 10 through 15, further including: one or more capacitors couplable with the plurality of second nodes and operable to shift the reference voltage from a first voltage to a second voltage after each of the second nodes of the plurality of memory cells is coupled to each other of the second nodes, where determining the logic state of the first memory cell is based at least in part on the second voltage.

Aspect 17: The apparatus of any of aspects 10 through 16, further including: a first plurality of transistors each coupled with a respective first node of the plurality of first nodes and each operable to maintain the respective first node below a threshold voltage; and a second plurality of transistors each coupled with a respective second node of the plurality of second nodes and each operable to maintain the respective second node below the threshold voltage.

Aspect 18: The apparatus of any of aspects 10 through 17, where the balancing component is operable to configure the logic states of the plurality of memory cells to satisfy the threshold ratio based at least in part on configuring the first quantity to be within a first range of values and configuring the second quantity to be within a second range of values.

An apparatus is described. The following provides an overview of aspects of the apparatus as described herein:

Aspect 19: An apparatus, including: a plurality of memory cells; a plurality of first nodes each couplable with a respective memory cell of the plurality of memory cells; a plurality of second nodes each couplable with a respective memory cell of the plurality of memory cells and a respective first node of the plurality of first nodes; a plurality of switching components each coupled with one or more respective second nodes of the plurality of second nodes; and a controller operable to cause the apparatus to: store a respective logic state at each of the plurality of memory cells, where the logic states of the plurality of memory cells are configured to satisfy a threshold ratio of a first quantity of memory cells of the plurality storing a first logic state to a second quantity of memory cells of the plurality storing a second logic state; develop, for each memory cell of the plurality, a respective sensed voltage at a respective first node and at a respective second node each associated with the memory cell, where each sensed voltage is representative of the respective logic state of the associated memory cell; generate a reference voltage for the plurality of memory cells based at least in part on coupling each of the second nodes of the plurality of memory cells to each other of the second nodes via the plurality of switching components; and determine a logic state of a first memory cell of the plurality based at least in part on the reference voltage and a first sensed voltage associated with the first memory cell.

Aspect 20: The apparatus of aspect 19, further including: a second plurality of switching components, where the controller is further operable to cause the apparatus to: couple, for each memory cell of the plurality, the respective first node with the respective second node via a respective switching component of the second plurality, where developing the respective sensed voltage for each memory cell of the plurality is based at least in part on coupling the respective first node with the respective second node.

Aspect 21: The apparatus of aspect 20, where the controller is further operable to cause the apparatus to: isolate, for each memory cell of the plurality, the respective first node from the respective second node after developing the respective sensed voltage for each memory cell of the plurality, where generating the reference voltage is based at least in part on isolating the respective first node from the respective second node.

Aspect 22: The apparatus of any of aspects 19 through 21, where, to determine the logic state of the first memory cell, the controller is operable to cause the apparatus to: compare the first sensed voltage with the reference voltage, where the first sensed voltage is developed at the respective first node associated with the first memory cell.

Aspect 23: The apparatus of any of aspects 19 through 22, where the controller is further operable to cause the apparatus to: maintain each of the second nodes of the plurality of memory cells coupled to each other of the second nodes while determining the logic state of the first memory cell.

Aspect 24: The apparatus of any of aspects 19 through 23, where the controller is further operable to cause the apparatus to: isolate each of the second nodes of the plurality of memory cells from each other of the second nodes before determining the logic state of the first memory cell.

Aspect 25: The apparatus of any of aspects 19 through 24, further including: one or more capacitors couplable with the plurality of second nodes, where the controller is further operable to cause the apparatus to: shift the reference voltage from a first voltage to a second voltage based at least in part on applying a voltage to the one or more capacitors after each of the second nodes of the plurality of memory cells is coupled to each other of the second nodes, where determining the logic state of the first memory cell is based at least in part on shifting the reference voltage.

Information and signals described herein may be represented using any of a variety of different technologies and techniques. For example, data, instructions, commands, information, signals, bits, symbols, and chips that may be referenced throughout the description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals can be communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components from one another, the controller affects a change that prevents signals from flowing between the components using a conductive path that previously permitted signals to flow.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other cases, the substrate may be a silicon-on-insulator (SOI) substrate, such as silicon-on-glass (SOG) or silicon-on-sapphire (SOS), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of these are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. A method, comprising:
    storing a respective logic state at each of a plurality of memory cells, wherein the logic states of the plurality of memory cells satisfy a threshold ratio of a first quantity of memory cells of the plurality storing a first logic state to a second quantity of memory cells of the plurality storing a second logic state;
    developing, for each memory cell of the plurality, a respective sensed voltage at a respective first node and at a respective second node each associated with the memory cell, wherein each sensed voltage is representative of the respective logic state of the associated memory cell;
    generating a reference voltage for the plurality of memory cells based at least in part on coupling each of the second nodes of the plurality of memory cells to each other of the second nodes; and
    determining a logic state of a first memory cell of the plurality based at least in part on the reference voltage and a first sensed voltage associated with the first memory cell.

2. The method of claim 1, further comprising:
    coupling, for each memory cell of the plurality, the respective first node with the respective second node, wherein developing the respective sensed voltage for each memory cell of the plurality is based at least in part on coupling the respective first node with the respective second node.

3. The method of claim 2, further comprising:
    isolating, for each memory cell of the plurality, the respective first node from the respective second node after developing the respective sensed voltage for each memory cell of the plurality, wherein generating the reference voltage is based at least in part on isolating the respective first node from the respective second node.

4. The method of claim 1, wherein determining the logic state of the first memory cell comprises:
    comparing the first sensed voltage with the reference voltage, wherein the first sensed voltage is developed at the respective first node associated with the first memory cell.

5. The method of claim 1, further comprising:
    maintaining each of the second nodes of the plurality of memory cells coupled to each other of the second nodes while determining the logic state of the first memory cell.

6. The method of claim 1, further comprising:
    isolating each of the second nodes of the plurality of memory cells from each other of the second nodes before determining the logic state of the first memory cell.

7. The method of claim 1, wherein generating the reference voltage comprises:
    shifting the reference voltage from a first voltage to a second voltage after coupling each of the second nodes of the plurality of memory cells to each other of the second nodes, wherein determining the logic state of the first memory cell is based at least in part on the second voltage.

8. The method of claim 1, wherein the logic states of the plurality of memory cells satisfy the threshold ratio based at least in part on the first quantity being within a first range of values and the second quantity being within a second range of values.

9. The method of claim 1, wherein the threshold ratio comprises the first quantity being equal to the second quantity.

10. An apparatus, comprising:
    a plurality of memory cells each operable to store a respective logic state;
    a balancing component operable to configure the logic states of the plurality of memory cells to satisfy a threshold ratio of a first quantity of memory cells of the plurality storing a first logic state to a second quantity of memory cells of the plurality storing a second logic state;
    a plurality of first nodes and a plurality of second nodes each couplable with a respective memory cell of the plurality of memory cells and each operable to be set to a respective sensed voltage representative of the respective logic state of the respective memory cell, wherein the plurality of second nodes are each couplable with a respective first node of the plurality of first nodes:
    a plurality of switching components operable to generate a reference voltage for the plurality of memory cells based at least in part on coupling each of the second nodes to each other of the second nodes; and
    a sense component operable to determine a logic state of a first memory cell of the plurality based at least in part on the reference voltage and a first sensed voltage associated with the first memory cell.

11. The apparatus of claim 10, further comprising:
    a second plurality of switching components each operable to couple, for a respective memory cell of the plurality, a respective first node with a respective second node, wherein setting the respective sensed voltage at each of the plurality of second nodes is based at least in part on coupling the respective first node with the respective second node.

12. The apparatus of claim 11, wherein each switching component of the second plurality is further operable to:
    isolate, for each memory cell of the plurality, the respective first node from the respective second node after setting the respective second node to the respective sensed voltage, wherein generating the reference voltage is based at least in part on isolating the respective first node from the respective second node.

13. The apparatus of claim 10, wherein the sense component is further operable to:
    receive the first sensed voltage from a respective first node associated with the first memory cell;
    receive the reference voltage from a respective second node associated with the first memory cell; and
    compare the first sensed voltage with the reference voltage, wherein determining the logic state of the first memory cell is based at least in part on the comparing.

14. The apparatus of claim 10, wherein the plurality of switching components is further operable to:
    maintain each of the second nodes coupled to each other of the second nodes while determining the logic state of the first memory cell.

15. The apparatus of claim 10, wherein the plurality of switching components is further operable to:
    isolate each of the second nodes from each other of the second nodes before determining the logic state of the first memory cell.

16. The apparatus of claim 10, further comprising:
one or more capacitors couplable with the plurality of second nodes and operable to shift the reference voltage from a first voltage to a second voltage after each of the second nodes of the plurality of memory cells is coupled to each other of the second nodes, wherein determining the logic state of the first memory cell is based at least in part on the second voltage.

17. The apparatus of claim 10, further comprising:
a first plurality of transistors each coupled with a respective first node of the plurality of first nodes and each operable to maintain the respective first node below a threshold voltage; and
a second plurality of transistors each coupled with a respective second node of the plurality of second nodes and each operable to maintain the respective second node below the threshold voltage.

18. The apparatus of claim 10, wherein the balancing component is operable to configure the logic states of the plurality of memory cells to satisfy the threshold ratio based at least in part on configuring the first quantity to be within a first range of values and configuring the second quantity to be within a second range of values.

19. An apparatus, comprising:
a plurality of memory cells;
a plurality of first nodes each couplable with a respective memory cell of the plurality of memory cells;
a plurality of second nodes each couplable with a respective memory cell of the plurality of memory cells and a respective first node of the plurality of first nodes:
a plurality of switching components each coupled with one or more respective second nodes of the plurality of second nodes; and
a controller operable to cause the apparatus to:
store a respective logic state at each of the plurality of memory cells, wherein the logic states of the plurality of memory cells are configured to satisfy a threshold ratio of a first quantity of memory cells of the plurality storing a first logic state to a second quantity of memory cells of the plurality storing a second logic state;
develop, for each memory cell of the plurality, a respective sensed voltage at a respective first node and at a respective second node each associated with the memory cell, wherein each sensed voltage is representative of the respective logic state of the associated memory cell;
generate a reference voltage for the plurality of memory cells based at least in part on coupling each of the second nodes of the plurality of memory cells to each other of the second nodes via the plurality of switching components; and
determine a logic state of a first memory cell of the plurality based at least in part on the reference voltage and a first sensed voltage associated with the first memory cell.

20. The apparatus of claim 19, further comprising:
a second plurality of switching components, wherein the controller is further operable to cause the apparatus to:
couple, for each memory cell of the plurality, the respective first node with the respective second node via a respective switching component of the second plurality, wherein developing the respective sensed voltage for each memory cell of the plurality is based at least in part on coupling the respective first node with the respective second node.

21. The apparatus of claim 20, wherein the controller is further operable to cause the apparatus to:
isolate, for each memory cell of the plurality, the respective first node from the respective second node after developing the respective sensed voltage for each memory cell of the plurality, wherein generating the reference voltage is based at least in part on isolating the respective first node from the respective second node.

22. The apparatus of claim 19, wherein, to determine the logic state of the first memory cell, the controller is operable to cause the apparatus to:
compare the first sensed voltage with the reference voltage, wherein the first sensed voltage is developed at the respective first node associated with the first memory cell.

23. The apparatus of claim 19, wherein the controller is further operable to cause the apparatus to:
maintain each of the second nodes of the plurality of memory cells coupled to each other of the second nodes while determining the logic state of the first memory cell.

24. The apparatus of claim 19, wherein the controller is further operable to cause the apparatus to:
isolate each of the second nodes of the plurality of memory cells from each other of the second nodes before determining the logic state of the first memory cell.

25. The apparatus of claim 19, further comprising:
one or more capacitors couplable with the plurality of second nodes, wherein the controller is further operable to cause the apparatus to:
shift the reference voltage from a first voltage to a second voltage based at least in part on applying a voltage to the one or more capacitors after each of the second nodes of the plurality of memory cells is coupled to each other of the second nodes, wherein determining the logic state of the first memory cell is based at least in part on shifting the reference voltage.

* * * * *